United States Patent
We et al.

(10) Patent No.: US 10,403,707 B2
(45) Date of Patent: Sep. 3, 2019

(54) ARRAY TYPE INDUCTOR

(71) Applicant: QUALCOMM Incorporated, San Diego, CA (US)

(72) Inventors: Hong Bok We, San Diego, CA (US); Chin-Kwan Kim, San Diego, CA (US); Joonsuk Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 104 days.

(21) Appl. No.: 15/476,823

(22) Filed: Mar. 31, 2017

(65) Prior Publication Data

US 2018/0286562 A1 Oct. 4, 2018

(51) Int. Cl.
*H01F 17/00* (2006.01)
*H01L 49/02* (2006.01)
*H01F 17/04* (2006.01)
*H01F 27/29* (2006.01)

(52) U.S. Cl.
CPC ......... *H01L 28/10* (2013.01); *H01F 17/0013* (2013.01); *H01F 17/04* (2013.01); *H01F 27/292* (2013.01); *H01F 2017/048* (2013.01)

(58) Field of Classification Search
CPC ......... H01F 27/2804; H01F 2027/2809; H01F 27/29; H01F 27/2852
USPC .................................. 336/200, 232; 257/531
See application file for complete search history.

(56) References Cited

U.S. PATENT DOCUMENTS

| | | | |
|---|---|---|---|
| 5,821,846 A * | 10/1998 | Leigh | H01F 17/0006 336/200 |
| 5,986,533 A | 11/1999 | Person et al. | |
| 6,054,914 A * | 4/2000 | Abel | H01F 1/344 336/200 |
| 6,084,515 A * | 7/2000 | Maitin | G08B 13/2411 340/572.3 |
| 6,587,025 B2 | 7/2003 | Smith et al. | |
| 7,173,508 B2 | 2/2007 | Anbo et al. | |
| 8,362,751 B2 | 1/2013 | Lin et al. | |
| 9,397,042 B2 | 7/2016 | Brunschwiler et al. | |
| 2008/0309442 A1* | 12/2008 | Hebert | H01F 27/292 336/65 |
| 2009/0237899 A1* | 9/2009 | Furnival | H01F 27/2804 361/761 |
| 2012/0306608 A1* | 12/2012 | Takenaka | H05K 1/165 336/200 |
| 2013/0342301 A1* | 12/2013 | Mano | H01F 27/2804 336/200 |

(Continued)

FOREIGN PATENT DOCUMENTS

| | | | | |
|---|---|---|---|---|
| JP | 2014032978 A | * | 2/2014 | ............ H01F 5/003 |
| JP | 2014175406 A | * | 9/2014 | |

*Primary Examiner* — Tszfung J Chan
(74) *Attorney, Agent, or Firm* — Muncy, Geissler, Olds & Lowe, P.C./Qualcomm

(57) ABSTRACT

Examples of this disclosure include a low profile inductor for use in any application with a multi-layer inductor pattern that allows control of optimum H values. Some examples of such an inductive device comprises a plurality of patterned metal coils arranged in a vertical stack, a plurality of conductive vias configured to couple each of the plurality of patterned metal coils together, and a magnetic material disposed between the plurality of patterned metal coils and within each of the plurality of patterned metal coils.

24 Claims, 10 Drawing Sheets

(56) References Cited

U.S. PATENT DOCUMENTS

2014/0034373 A1\* 2/2014 Yoshikawa ............. H01F 5/003
　　　　　　　　　　　　　　　　　　　　174/260
2015/0302974 A1\* 10/2015 Zhao ................... H01F 17/0013
　　　　　　　　　　　　　　　　　　　　361/270

\* cited by examiner

ARRAY TYPE INDUCTOR

FIELD OF DISCLOSURE

This disclosure relates generally inductors, and more specifically, but not exclusively, array type inductors.

BACKGROUND

An inductor, also called a coil or reactor, is a passive two-terminal electrical component which resists changes in electric current passing through it. It consists of a conductor such as a wire, usually wound into a coil. Energy is stored in a magnetic field in the coil as long as current flows. When the current flowing through an inductor changes, the time-varying magnetic field induces a voltage in the conductor, according to Faraday's law of electromagnetic induction. According to Lenz's law the direction of induced electromotive force is always such that it opposes the change in current that created it. As a result, inductors always oppose a change in current, in the same way that a flywheel opposes a change in rotational velocity.

An inductor is characterized by its inductance, the ratio of the voltage to the rate of change of current, which has units of henries (H). Inductors have values that typically range from 1 µH (10-6H) to 1H. Many inductors have a magnetic core made of iron or ferrite inside the coil, which serves to increase the magnetic field and thus the inductance. Along with capacitors and resistors, inductors are one of the three passive linear circuit elements that make up electric circuits. Inductors are widely used in alternating current (AC) electronic equipment, particularly in wireless communication devices. They are also used to block AC while allowing DC to pass; inductors designed for this purpose are called chokes. They are also used in electronic filters to separate signals of different frequencies, and in combination with capacitors to make tuned circuits.

Conventional inductor manufacturing methods use wire wound, multi-layer, and film type structure, but result in larger physical dimensions than other passive component. Also, inductor loop coils are typically only one loop, which leads to thin process type inductors with low H values. Conventional patterning inductor concepts use single loop patterning and general dielectric material that results in a complex manufacturing process and H values lower than is generally required.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, an inductive device comprises: a plurality of patterned metal coils arranged in a vertical stack and embedded in a substrate or a printed circuit board to form a plurality of layers; a plurality of conductive vias configured to couple each of the plurality of patterned metal coils together; a magnetic material disposed between the plurality of patterned metal coils and within each of the plurality of patterned metal coils; a pad layer proximate to a bottom layer of the plurality of patterned metal coils and coupled to the bottom layer of the plurality of patterned metal coils; and a plurality of solder balls, each of the plurality of solder balls coupled to the pad layer opposite bottom layer of the plurality of patterned metal coils.

In another aspect, an inductive device comprises: means for conducting current, the means for conducting current arranged in a vertical stack and embedded in a substrate or a printed circuit board to form a plurality of layers; means for coupling configured to couple the means for conducting current together; means for enhancing a magnetic field disposed in the means for conducting current; a pad layer proximate to a bottom layer of the means for conducting current and coupled to the bottom layer of the means for conducting current; and a plurality of solder balls, each of the plurality of solder balls coupled to the pad layer opposite bottom layer of the means for conducting current.

In still another aspect, an integrated circuit package comprises: an integrated circuit attached to a top layer of a substrate; a plurality of patterned metal coils arranged in a vertical stack and embedded in the substrate to form a plurality of layers; a plurality of conductive vias configured to couple each of the plurality of patterned metal coils together; a magnetic material disposed between the plurality of patterned metal coils and within each of the plurality of patterned metal coils; a pad layer proximate to a bottom layer of the plurality of patterned metal coils and coupled to the bottom layer of the plurality of patterned metal coils; and a plurality of solder balls, each of the plurality of solder balls coupled to the pad layer opposite bottom layer of the plurality of patterned metal coils.

In still another aspect, a method for manufacture of an inductive device, comprises: applying a first metal layer to a carrier layer; patterning the first metal layer to form patterned metal coils; applying a first dielectric layer to the first metal layer; forming a plurality of first via cavities in the first dielectric layer; forming a plurality of first conductive vias in the plurality of first via cavities; applying a second metal layer to the first dielectric layer; patterning the second metal layer to form patterned metal coils; applying a second dielectric layer to the second metal layer; forming a plurality of second via cavities in the second dielectric layer; forming a plurality of second conductive vias in the plurality of second via cavities; removing the carrier layer; and forming a pad layer on the first metal layer opposite the first dielectric layer.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
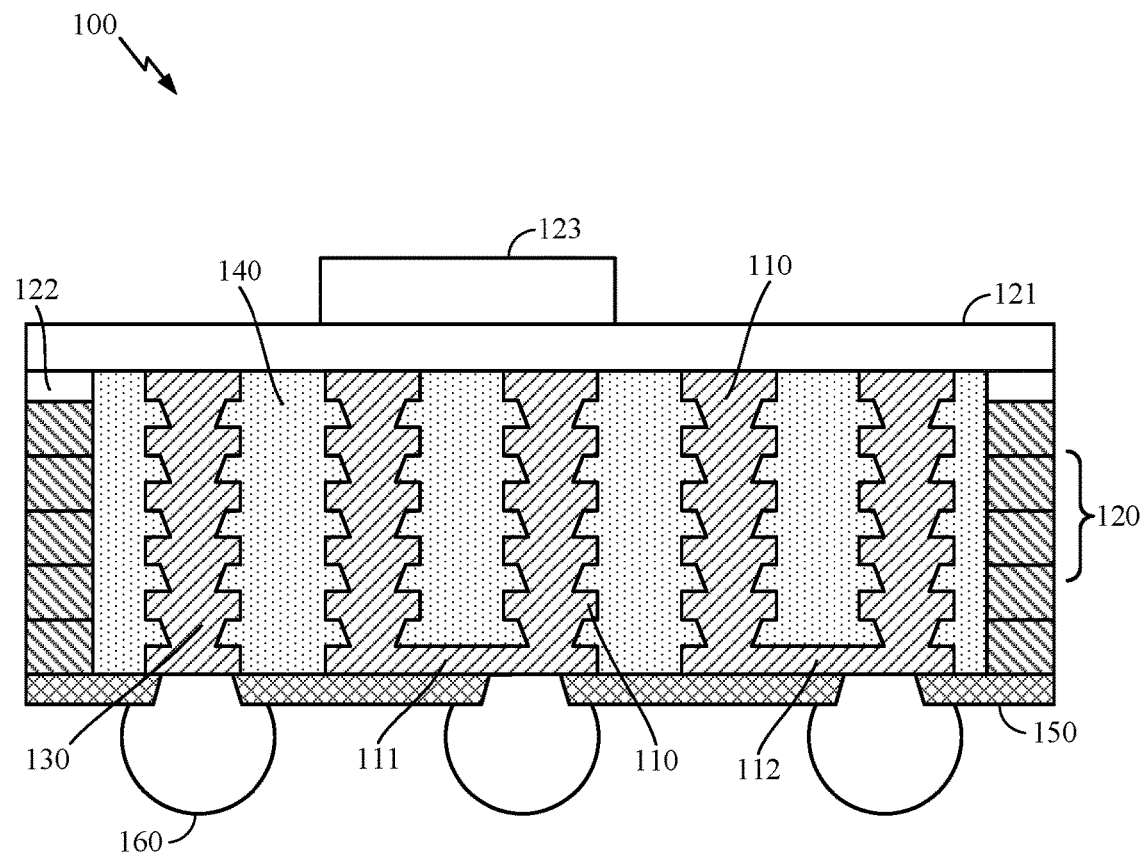
FIG. 1 illustrates a side view of an inductive device in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. Some examples of the disclosure use a substrate pattern process to make multiple and parallel structures for an inductor to increase the H value of the inductor. This simplified process may be used to create various types and shapes to meet design requirements to that include thinner profiles than would result if a dedicate inductor component was used. The resulting structure may be used in conjunction with package structures such as Ball Grid Array (BGA) that can be assembled on the system board and cover overall system inductor values. Some examples may use an inductor loop pattern area filled magnetic material such that the resulting H value may be similar to a dedicate component inductor. The examples herein may provide many benefits. Such benefits include low profile inductors usable for any application; reduced package or module thickness; high yield and low tolerance inductors using a patterned stack and via connections; low profile modules using a ball pad or connection method after inductor molding; and a multi-layer parallel structure that allows more control to optimize the H value.

FIG. 1 illustrates a side view of an inductive device in accordance with some examples of the disclosure. As shown in FIG. 1, an inductive device 100 may include a plurality of patterned metal coils 110 vertically stacked and embedded in a substrate 120 (e.g. semiconductor substrate or printed circuit board), a plurality of conductive vias 130 between each layer of the plurality of patterned metal coils 110 and configured to couple each of the plurality patterned metal coils 110 together, a magnetic material 140 (e.g. ferrite or magnetic alloys) disposed between and within the plurality of patterned metal coils 110, a pad layer 150 proximate a bottom of the substrate 120, and a plurality of solder balls 160 coupled to the pad layer 150. The inductive device 100 may also include a first electrode 111 coupled to one of the plurality of patterned metal coils 110, a second electrode 112 coupled to one of the plurality of patterned metal coils 110, a top layer 121 of the substrate 120, and a redistribution layer 122 proximate to the top layer 121 of the substrate 120 configured to redistribute electrical signals from, for example, an integrated circuit 123 (e.g. a semiconductor die, a logic die, a memory, or a passive electrical component) attached to the top layer 121 of the substrate 120 and coupled to the redistribution layer 122.

While six layers of patterned metal coils are shown, it should be understood that more or less layers of patterned metal coils and the number of side portions 125 may be varied depending on the desired H value of the inductive device 100. While three solder balls 160 are shown, it should be understood that more or less may be used and that the solder balls may be arranged in a ball grid array, a land grid array, or cooper pillars may be substituted for the plurality of solder balls 160. While one redistribution layer 122 positioned near the top layer 121 of the substrate 120 is shown, more than one redistribution layers may be used and the redistribution layer 122 may be positioned elsewhere such as above the top layer 122, near a bottom of the substrate 120, etc. While one integrated circuit 123 is shown, more than one integrated circuit may be used and the integrated circuit may be attached to the substrate 120 or positioned elsewhere such as to one side or below the substrate 120. While the first electrode 111 and the second electrode 112 are shown at the bottom of the substrate 120, it should be understood that the first electrode 111 and the second electrode 112 may be positioned elsewhere, such as near the top layer 121 or on either side of the substrate 120, and in different locations from each other.

Figure 2:
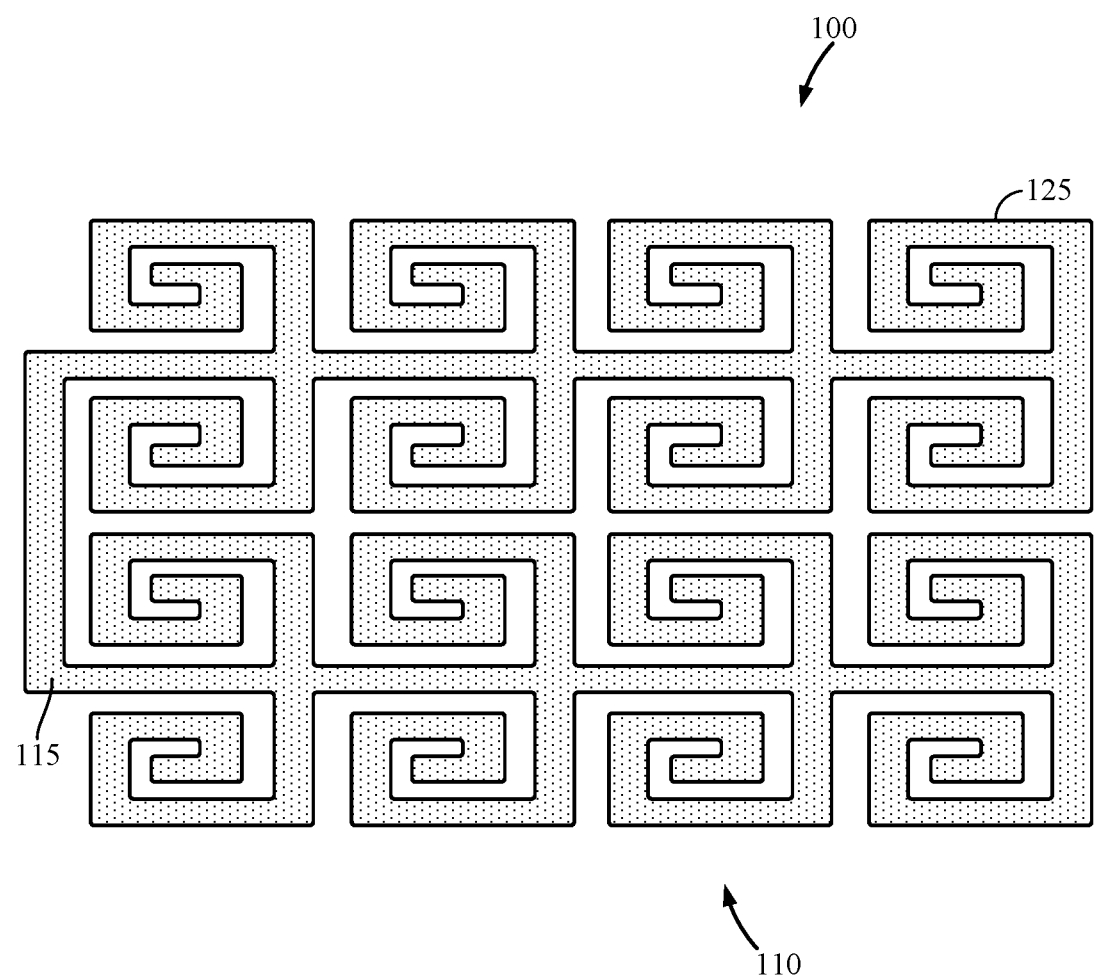
FIG. 2 illustrates a partial two dimensional view of an inductive device in accordance with some examples of the disclosure.

FIG. 2 illustrates a partial two dimensional view of an inductive device in accordance with some examples of the disclosure. As shown in FIG. 2, the inductive device 100 may include a plurality of patterned metal coils 110 that includes a U shaped central portion 115 and a plurality of spiral shaped side portions 125. While each of the plurality of spiral shaped side portions 125 are shown with right angles, it should be understood that the side portions 125 may not be the same shape or may include circular spirals forming loops.

Figure 3:
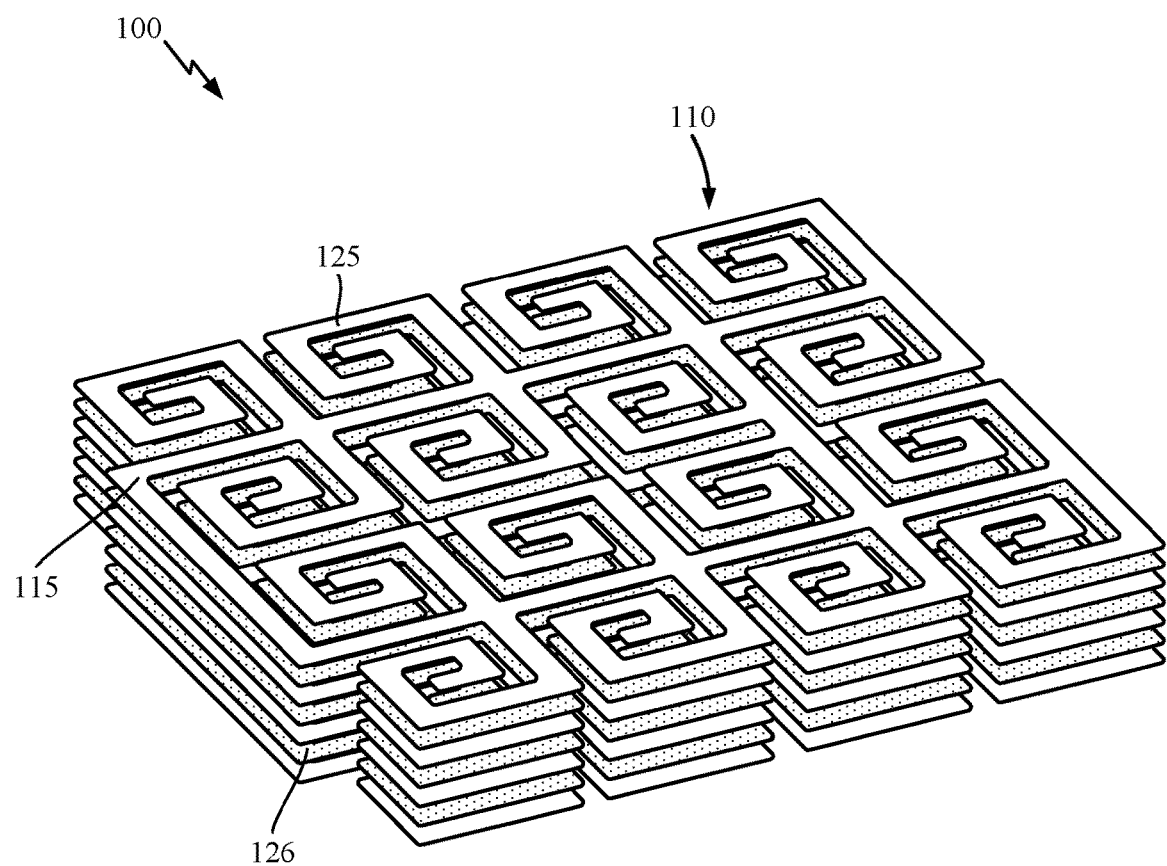
FIG. 3 illustrates a partial three dimensional side view of an inductive device in accordance with some examples of the disclosure.

FIG. 3 illustrates a partial three dimensional side view of an inductive device in accordance with some examples of the disclosure. As shown in FIG. 3, the inductive device 100 may include a plurality of patterned metal coils 110 with each including a U shaped central portion 115 and a plurality of spiral shaped side portions 125 and a plurality of dielectric layers 126 between of the plurality of patterned metal coils 110. The plurality of dielectric layers 126 may be made from the substrate 120 material as disclosed below. While each of the plurality of spiral shaped side portions 125 of one of the plurality of patterned metal coils 110 are shown in parallel along a single U shaped central portion 125, it should be understood that some or all of the plurality of spiral shaped side portions 125 may be configured in series and the U shaped central portion 115 may be one or more central portions. In addition, the plurality of patterned metal coils 110 may be coupled to each other in parallel as shown or in series.

Figure 4A:
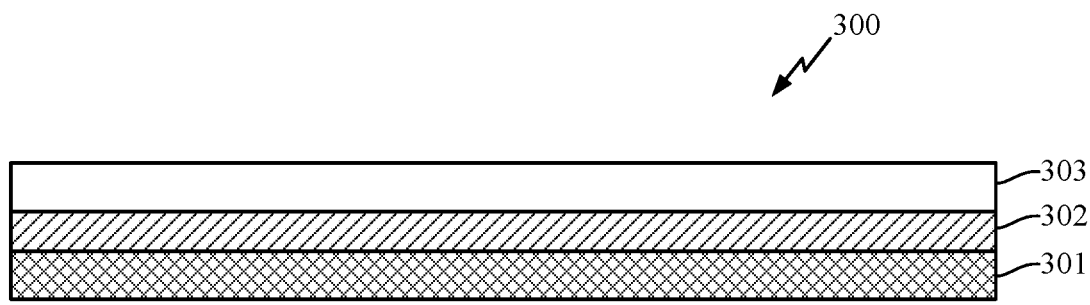
FIGS. 4A-K illustrate a partial process of manufacture for an inductive device in accordance with some examples of the disclosure.
Figure 4B:
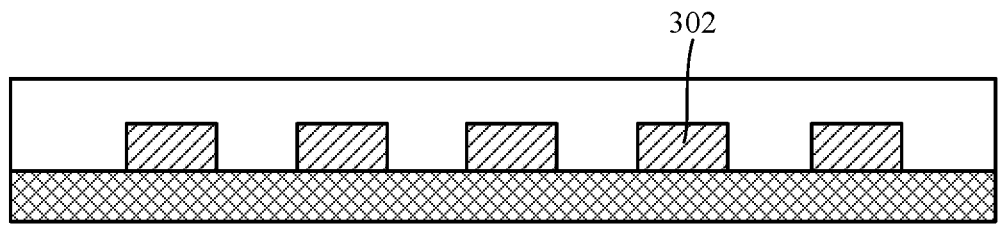
Figure 4C:
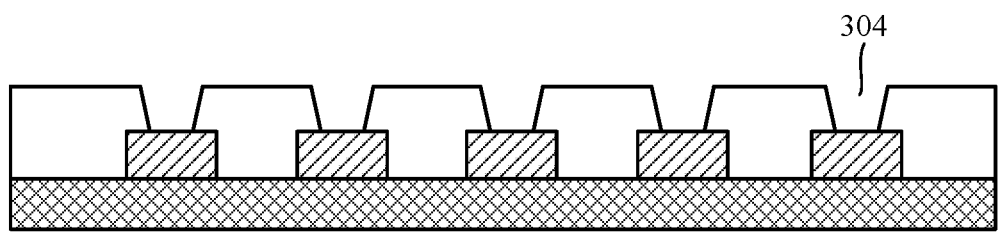
Figure 4D:
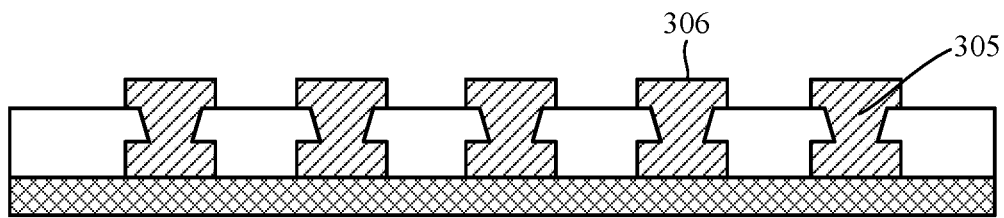
Figure 4E:
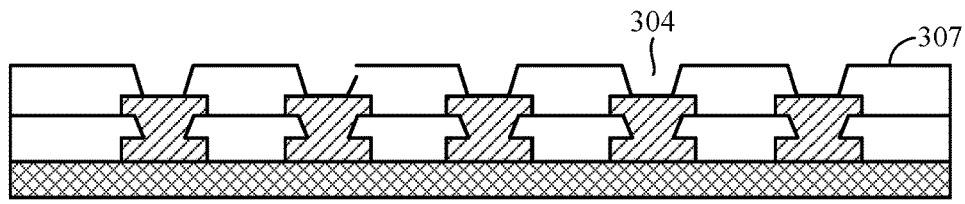

FIGS. 4A-K illustrate a partial process of manufacture for an inductive device in accordance with some examples of the disclosure. As shown in FIG. 4A, the partial process 300 begins with a carrier layer 301, a first metal layer 302 (e.g. copper seed layer) on the carrier layer 301, and a first dielectric layer 303 on the first metal layer 302. The layers 302 and 303 shown may be laminated or applied by deposition. As shown in FIG. 4B, the partial process 300 continues with patterning of the first metal layer 302 to create patterned metal coils (e.g. one of the plurality of patterned metal coils 110). This patterning may take place before or after the first dielectric layer 303 is added to the first metal layer 302. The patterning may be a subtractive, semi-additive, or additive type process. As shown in FIG. 4C, the partial process 300 continues with creation of via holes 304. The via holes 304 may be created with a blind via hole laser drilling process or similar. As shown in FIG. 4D, the partial process 300 continues with filling or plating the via holes 305 to create a plurality of conductive vias 305 and a second metal layer 306 is applied above the first dielectric layer 303 and then patterned to create patterned metal coils. As shown in FIG. 4E, the partial process 300 continues with application of a second dielectric layer 307 on the second metal layer 306 and via holes 304 are create in the second dielectric layer 307.

Figure 4F:
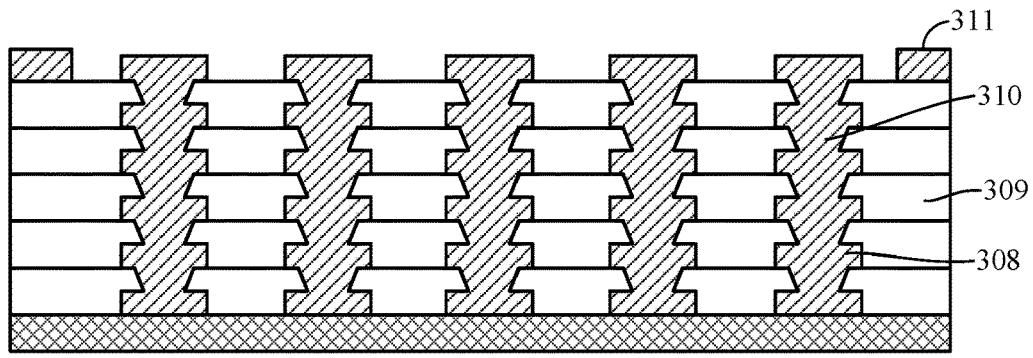
Figure 4G:
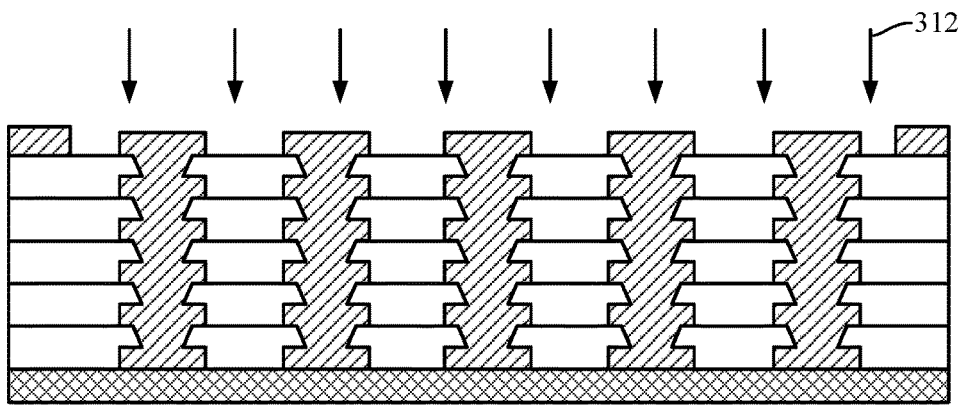
Figure 4H:
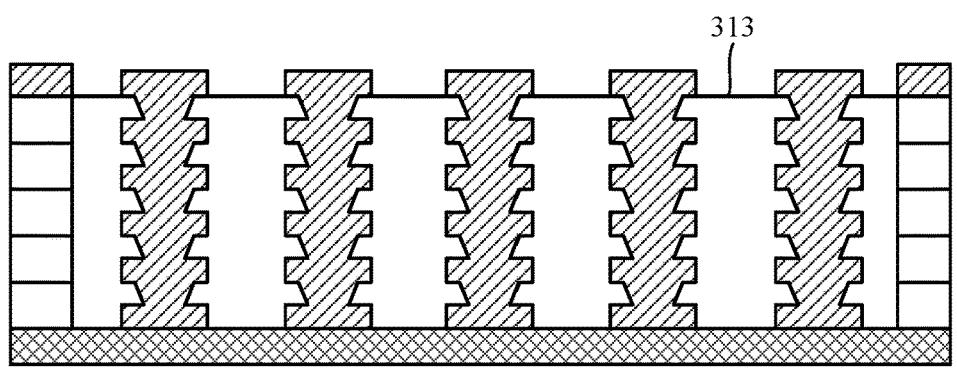
Figure 4I:
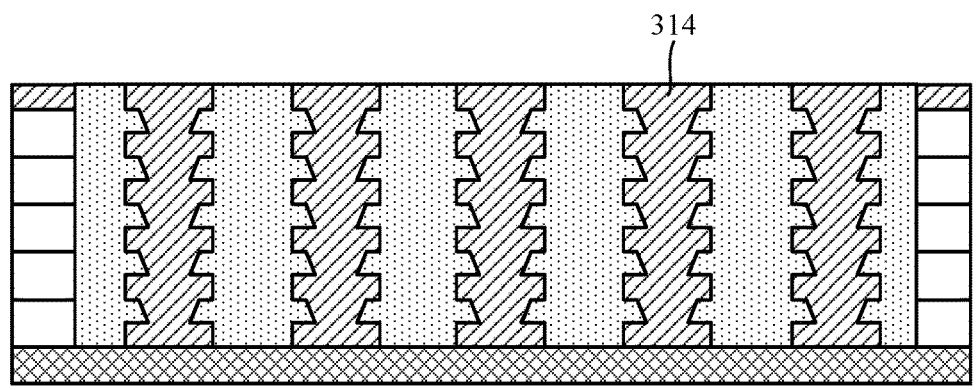
Figure 4J:
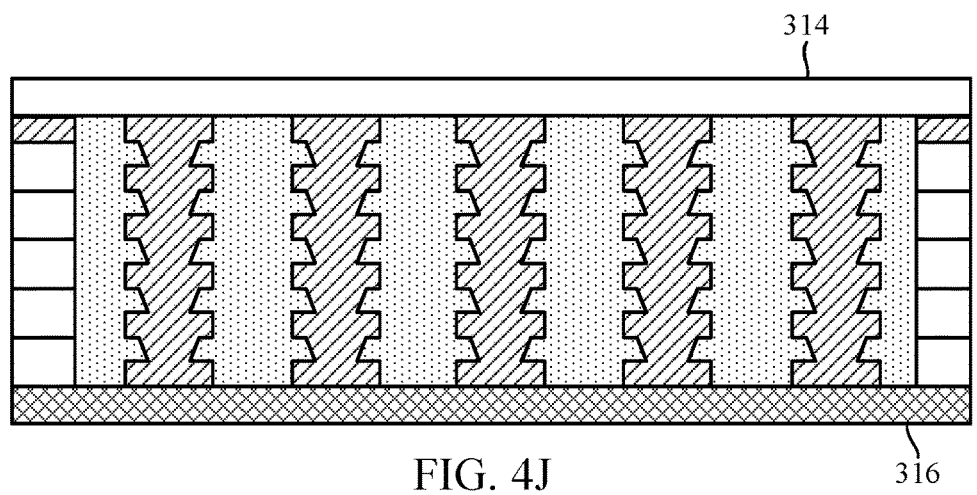
Figure 4K:
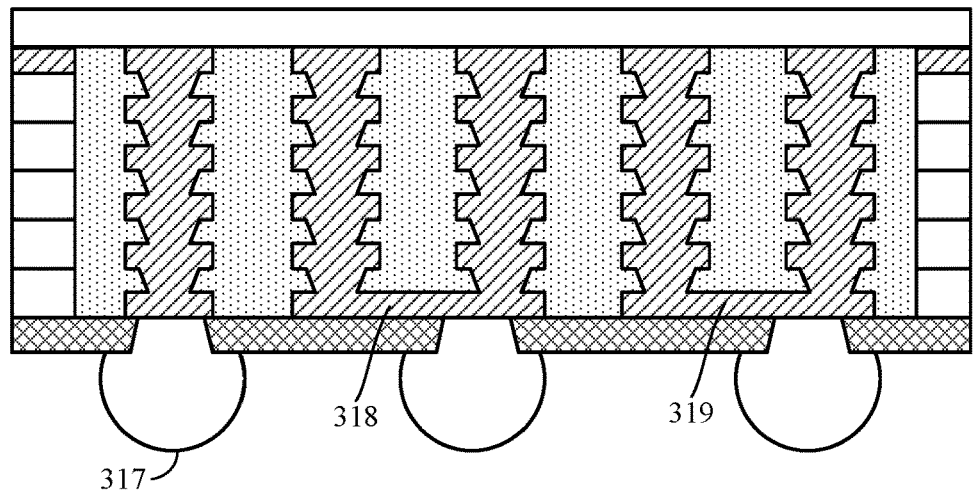

As shown in FIG. 4F, the partial process 300 continues with repeating the processes shown in FIGS. 4D and 4E until a plurality of patterned metal coils 308, a plurality of dielectric layers 309, and a plurality of conductive vias 310 are created in a vertical stack with a redistribution layer 311 on the top of the stack. The number of layers may be varied based on the desired H value of the inductive device 300. As shown in FIG. 4G, the partial process 300 continues with applying a mask 312 to the top layer to protect the patterned metal coils 308 and the redistribution layer 311. As shown in FIG. 4H, the partial process 300 continues with etching cavities 313 between the layers and within the patterns of the plurality of patterned metal coils 308. The etching may be a chemical or plasma process, for example, to avoid the complicated process or laser or mechanical drilling. As shown in FIG. 4I, the partial process 300 continues with filling the cavities 313 with a magnetic material 314 such as ferrite or magnetic alloys. As shown in FIG. 4J, the partial process 300 continues with the lamination and patterning of a top layer 315, removal of the carrier 301, and a pad layer 316 for the inductive device 300. As shown in FIG. 4K, the partial process 300 concludes with patterning of the pad layer 316, formation of a first electrode 318, formation of a second electrode 319, and attachment of a plurality of solder balls 317 to the pad layer 316. While not shown, one or more integrated circuits may be added to the top layer of the substrate and coupled to the redistribution layer.

Figure 5:
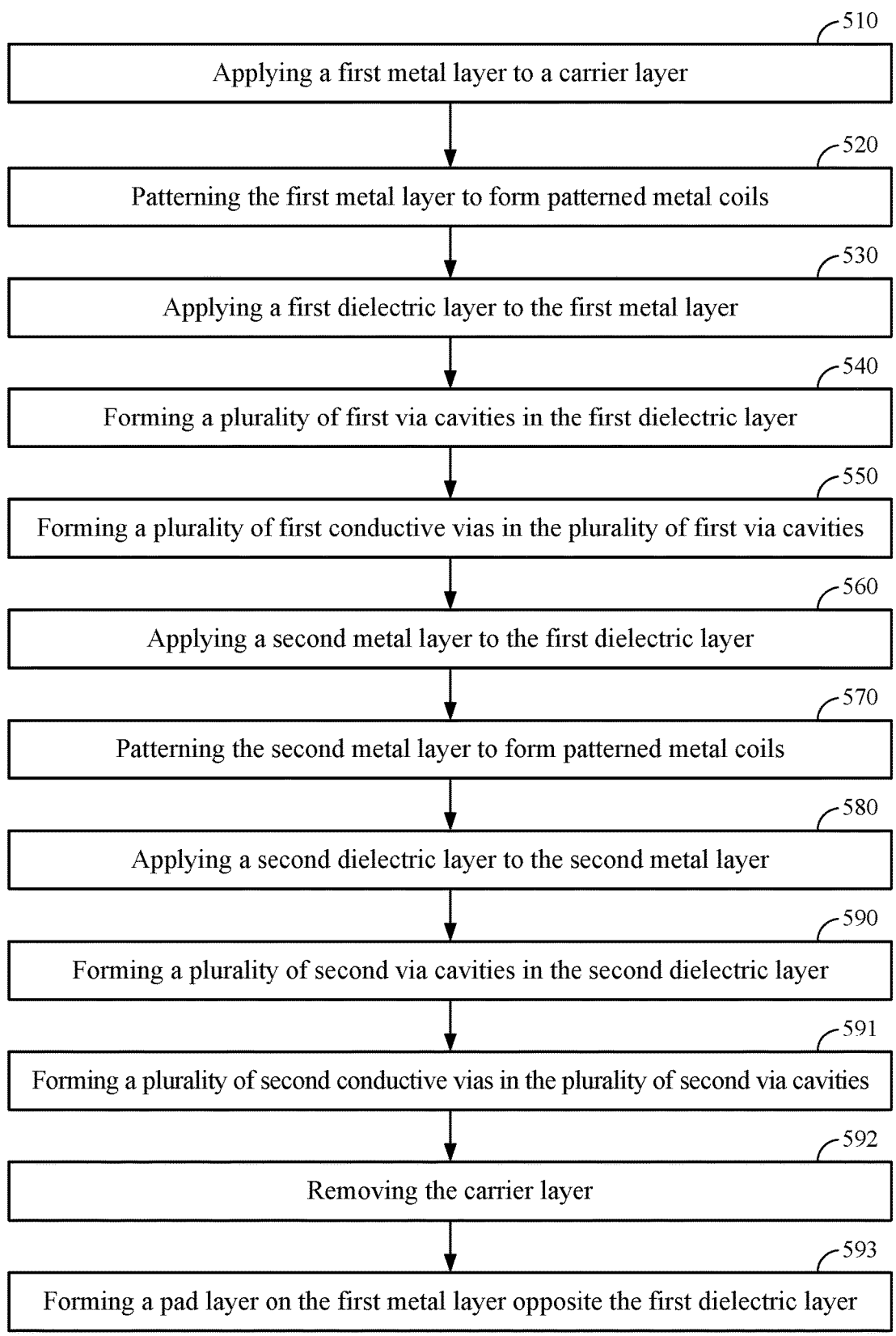
FIG. 5 illustrates a method for manufacture of an inductive device in accordance with some examples of the disclosure.

FIG. 5 illustrates a method for manufacture of an inductive device in accordance with some examples of the disclosure. As shown in FIG. 5, the method begins in block 510 with applying a first metal layer to a carrier layer. The method continues in block 520 with patterning the first metal layer to form patterned metal coils. The method continues in block 530 with applying a first dielectric layer to the first metal layer. The method continues in block 540 with forming a plurality of first via cavities in the first dielectric layer. The method continues in block 550 with forming a plurality of first conductive vias in the plurality of first via cavities. The method continues in block 560 with applying a second metal layer to the first dielectric layer. The method continues in block 570 with patterning the second metal layer to form patterned metal coils. The method continues in block 580 with applying a second dielectric layer to the second metal layer. The method continues in block 590 with forming a plurality of second via cavities in the second dielectric layer. The method continues in block 591 with forming a plurality of second conductive vias in the plurality of second via cavities. The method continues in block 592 with removing the carrier layer. The method concludes in block 593 with forming a pad layer on the first metal layer opposite the first dielectric layer.

Figure 6:
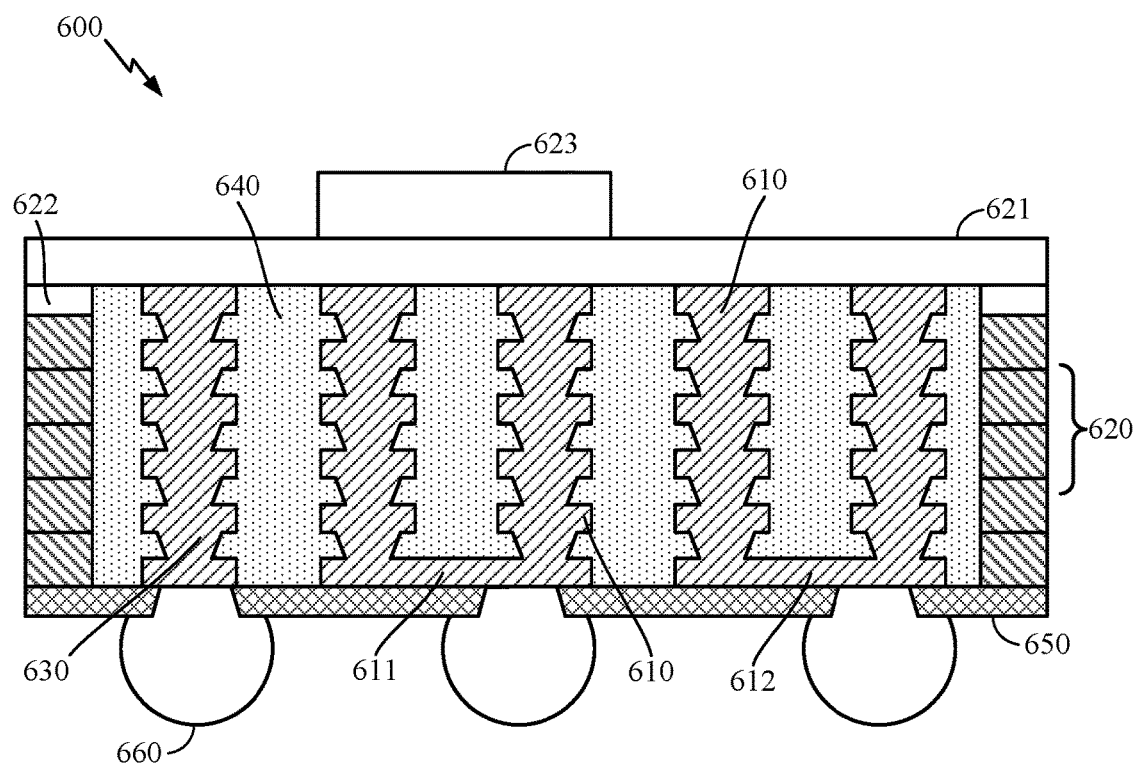
FIG. 6 illustrates a side view of an inductive device in accordance with some examples of the disclosure.

FIG. 6 illustrates a side view of an inductive device in accordance with some examples of the disclosure. As shown in FIG. 6, an inductive device 600 (e.g. inductive device 100) may include a plurality of patterned metal coils 610 vertically stacked and embedded in a substrate 620 (e.g. semiconductor substrate or printed circuit board), a plurality of conductive vias 630 between each layer of the plurality of patterned metal coils 610 and configured to couple each of the plurality patterned metal coils 610 together, a magnetic material 640 (e.g. ferrite or magnetic alloys) disposed between and within the plurality of patterned metal coils 610, a pad layer 650 proximate a bottom of the substrate 620, and a plurality of solder balls 660 coupled to the pad layer 650. The inductive device 600 may also include a first electrode 611 coupled to one of the plurality of patterned metal coils 610, a second electrode 612 coupled to one of the plurality of patterned metal coils 610, a top layer 621 of the substrate 620, and a redistribution layer 622 proximate to the top layer 621 of the substrate 620 configured to redistribute electrical signals from, for example, an integrated circuit 623 (e.g. a semiconductor die, a logic die, a memory, or a passive electrical component) attached to the top layer 621 of the substrate 620 and coupled to the redistribution layer 622.

While six layers of patterned metal coils are shown, it should be understood that more or less layers of patterned metal coils may be used depending on the desired H value of the inductive device 600. While three solder balls 660 are shown, it should be understood that more or less may be used and that the solder balls may be arranged in a ball grid array, a land grid array, or cooper pillars may be substituted for the plurality of solder balls 660. While one redistribution layer 622 positioned near the top layer 621 of the substrate 620 is shown, more than one redistribution layers may be used and the redistribution layer 622 may be positioned elsewhere such as above the top layer 622, near a bottom of the substrate 620, etc. While one integrated circuit 623 is shown, more than one integrated circuit may be used and the integrated circuit may be attached to the substrate 620 or positioned elsewhere such as to one side or below the substrate 620. While the first electrode 611 and the second electrode 612 are shown at the bottom of the substrate 620, it should be understood that the first electrode 611 and the second electrode 612 may be positioned elsewhere, such as near the top layer 621 or on either side of the substrate 620, and in different locations from each other.

Figure 7:
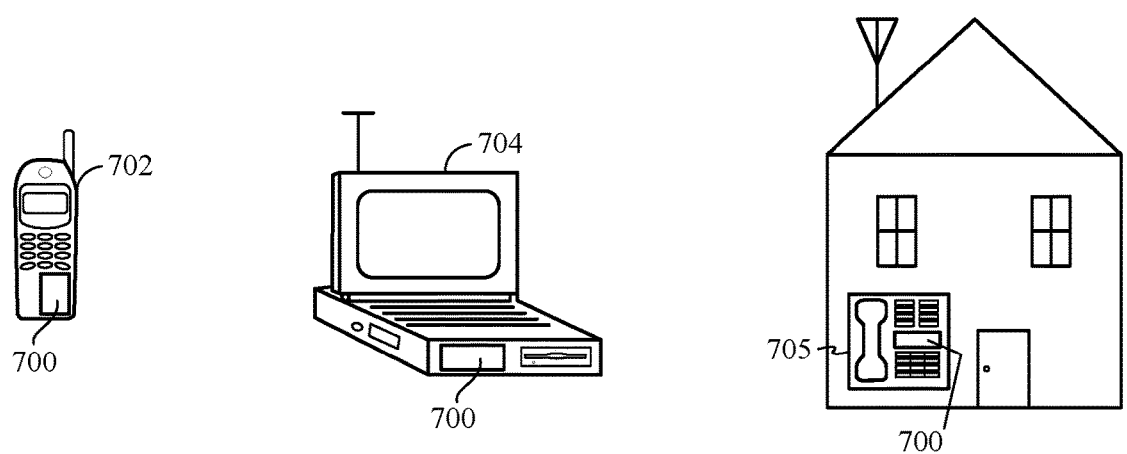
FIG. 7 illustrates various electronic devices that may be integrated with any of the aforementioned integrated device, semiconductor device, integrated circuit, die, interposer, package or package-on-package (PoP) in accordance with some examples of the disclosure.

FIG. 7 illustrates various electronic devices that may be integrated with any of the aforementioned inductive device, semiconductor device, integrated circuit, die, interposer, package or package-on-package (PoP) in accordance with some examples of the disclosure. For example, a mobile phone device 702, a laptop computer device 704, and a fixed location terminal device 706 may include an integrated device 700 as described herein. The integrated device 700 may be, for example, any of the integrated circuits, dies, integrated devices, integrated device packages, integrated circuit devices, device packages, integrated circuit (IC) packages, package-on-package devices described herein. The devices 702, 704, 706 illustrated in FIG. 7 are merely exemplary. Other electronic devices may also feature the integrated device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

Figure 8:
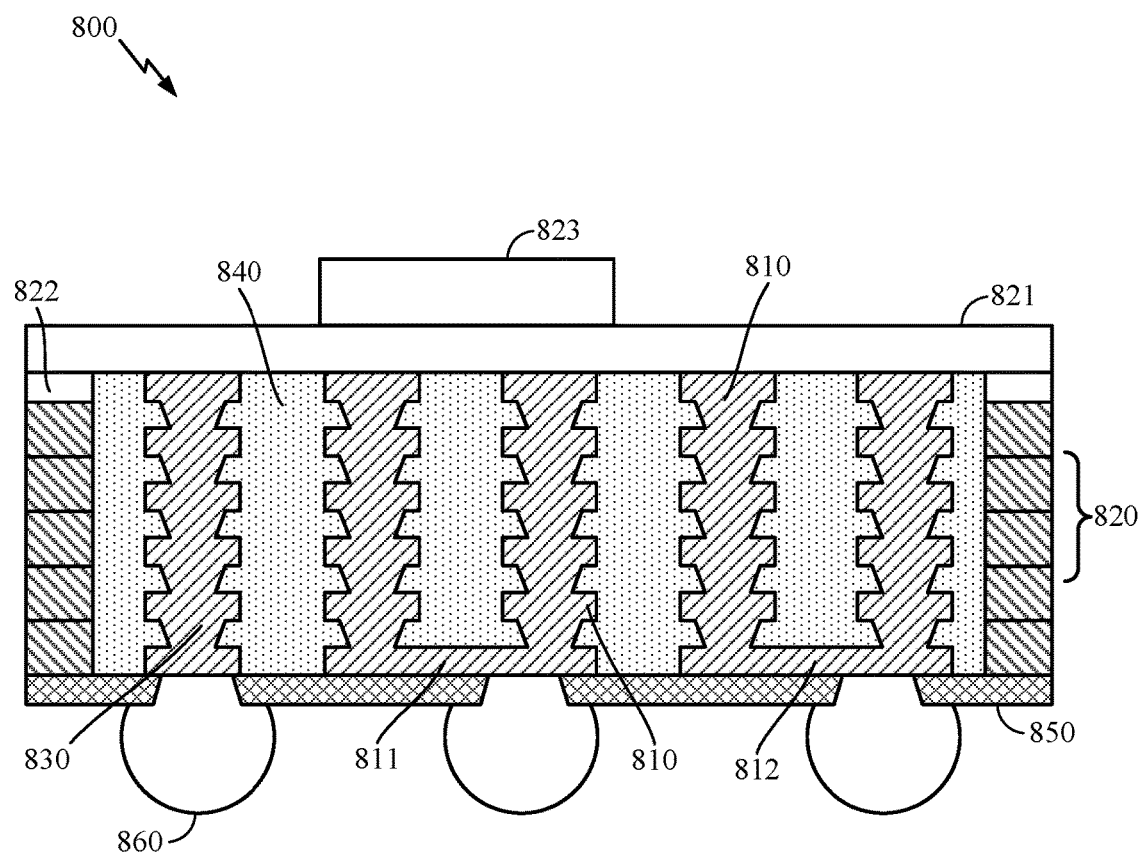
FIG. 8 illustrates a side view of an inductive device in accordance with some examples of the disclosure.

FIG. 8 illustrates a side view of an inductive device in accordance with some examples of the disclosure. As shown in FIG. 8, an inductive device 800 may include a means for conducting current 810 (e.g. plurality of patterned metal coils 110) vertically stacked and embedded in a substrate 820 (e.g. semiconductor substrate or printed circuit board), a means for coupling 830 (e.g. plurality of conductive vias 130) between each layer of the means for conducting current 810 and configured to couple each of the means for conducting current 810 together, a means for enhancing a magnetic field 840 (e.g. magnetic material 140) disposed between and within the means for conducting current 810, a pad layer 850 proximate a bottom of the substrate 820, and a plurality of solder balls 860 coupled to the pad layer 850. The inductive device 800 may also include a first electrode 811 coupled to one of the means for conducting current 810, a second electrode 812 coupled to one of the means for conducting current 810, a top layer 821 of the substrate 820, and a redistribution layer 822 proximate to the top layer 821 of the substrate 820 configured to redistribute electrical signals from, for example, an integrated circuit 823 (e.g. a semiconductor die, a logic die, a memory, or a passive electrical component) attached to the top layer 821 of the substrate 820 and coupled to the redistribution layer 822.

While six layers of means for conducting current 810 are shown, it should be understood that more or less layers of means for conducting current 810 and the number of side portions 825 may be varied depending on the desired H value of the inductive device 800. While three solder balls 860 are shown, it should be understood that more or less may be used and that the solder balls may be arranged in a ball grid array, a land grid array, or cooper pillars may be substituted for the plurality of solder balls 860. While one redistribution layer 822 positioned near the top layer 821 of the substrate 820 is shown, more than one redistribution layers may be used and the redistribution layer 822 may be positioned elsewhere such as above the top layer 822, near a bottom of the substrate 820, etc. While one integrated circuit 823 is shown, more than one integrated circuit may be used and the integrated circuit may be attached to the substrate 820 or positioned elsewhere such as to one side or below the substrate 820. While the first electrode 811 and the second electrode 812 are shown at the bottom of the substrate 820, it should be understood that the first electrode 811 and the second electrode 812 may be positioned elsewhere, such as near the top layer 821 or on either side of the substrate 820, and in different locations from each other.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

One or more of the components, processes, features, and/or functions illustrated in FIGS. 1-8 may be rearranged and/or combined into a single component, process, feature or function or embodied in several components, processes, or functions. Additional elements, components, processes, and/or functions may also be added without departing from the disclosure. It should also be noted that FIGS. 1-8 and its corresponding description in the present disclosure is not limited to dies and/or ICs. In some implementations, FIGS. 1-8 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An inductive device comprising:
a plurality of patterned metal coils arranged in a vertical stack and embedded in a substrate or a printed circuit board to form a plurality of layers, wherein each of the plurality of patterned metal coils comprises a U shaped central portion and a plurality of side portions each configured to form a spiral;
a plurality of conductive vias configured to couple each of the plurality of patterned metal coils together;
a magnetic material disposed between the plurality of patterned metal coils and within each of the plurality of patterned metal coils;
a pad layer proximate to a bottom layer of the plurality of patterned metal coils and coupled to the bottom layer of the plurality of patterned metal coils; and
a plurality of solder balls, each of the plurality of solder balls coupled to the pad layer opposite the bottom layer of the plurality of patterned metal coils.

2. The inductive device of claim 1, wherein the magnetic material comprises a homogenous structure between the plurality of layers.

3. The inductive device of claim 1, wherein each of the plurality of patterned metal coils has a first pattern configured to allow for lamination and filling without drilling.

4. The inductive device of claim 3, wherein the first pattern is filled with the magnetic material.

5. The inductive device of claim 1, wherein the plurality of solder balls are configured in a ball grid array or a land grid array.

6. The inductive device of claim 1, wherein the plurality of side portions extend on each side of the central portion in parallel.

7. The inductive device of claim 6, wherein the central portion is U shaped and each of the plurality of side portions is coupled to the central portion.

8. The inductive device of claim 1, wherein the inductive device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

9. An inductive device comprising:
- means for conducting current, the means for conducting current arranged in a vertical stack and embedded in a substrate or a printed circuit board to form a plurality of layers, wherein the means for conducting current comprises a U shaped central portion and a plurality of side portions each configured to form a spiral;
- means for coupling configured to couple the means for conducting current together;
- means for enhancing a magnetic field disposed in the means for conducting current;
- a pad layer proximate to a bottom layer of the means for conducting current and coupled to the bottom layer of the means for conducting current; and
- a plurality of solder balls, each of the plurality of solder balls coupled to the pad layer opposite the bottom layer of the means for conducting current.

10. The inductive device of claim 9, wherein the means for enhancing the magnetic field comprises a homogenous structure in the means for conducting current.

11. The inductive device of claim 9, wherein the means for conducting current has a first pattern configured to allow for lamination and filling without drilling.

12. The inductive device of claim 11, wherein the first pattern is filled with the means for enhancing the magnetic field.

13. The inductive device of claim 9, wherein the plurality of solder balls are configured in a ball grid array or a land grid array.

14. The inductive device of claim 9, wherein the plurality of side portions extend on each side of the central portion in parallel.

15. The inductive device of claim 14, wherein the plurality of side portions is coupled to the central portion.

16. The inductive device of claim 9, wherein the inductive device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

17. An integrated circuit package comprising:
- an integrated circuit attached to a top layer of a substrate;
- a plurality of patterned metal coils arranged in a vertical stack and embedded in the substrate to form a plurality of layers, wherein each of the plurality of patterned metal coils comprises a U shaped central portion and a plurality of side portions each configured to form a spiral;
- a plurality of conductive vias configured to couple each of the plurality of patterned metal coils together;
- a magnetic material disposed between the plurality of patterned metal coils and within each of the plurality of patterned metal coils;
- a pad layer proximate to a bottom layer of the plurality of patterned metal coils and coupled to the bottom layer of the plurality of patterned metal coils; and
- a plurality of solder balls, each of the plurality of solder balls coupled to the pad layer opposite the bottom layer of the plurality of patterned metal coils.

18. The integrated circuit package of claim 17, wherein the magnetic material comprises a homogenous structure between the plurality of layers.

19. The integrated circuit package of claim 17, wherein each of the plurality of patterned metal coils has a first pattern configured to allow for lamination and filling without drilling.

20. The integrated circuit package of claim 19, wherein the first pattern is filled with the magnetic material.

21. The integrated circuit package of claim 17, wherein the plurality of solder balls are configured in a ball grid array or a land grid array.

22. The integrated circuit package of claim 17, wherein the plurality of side portions extend on each side of the central portion in parallel.

23. The integrated circuit package of claim 22, wherein each of the plurality of side portions is coupled to the central portion.

24. The integrated circuit package of claim 17, wherein the integrated circuit package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

* * * * *